United States Patent [19]
Iwamoto et al.

[11] Patent Number: 5,687,947
[45] Date of Patent: Nov. 18, 1997

[54] MOUNTING METHOD

[75] Inventors: Kazunori Iwamoto, Yokohama; Shunichi Uzawa, Tokyo; Takao Kariya, Hino; Ryuichi Ebinuma, Kawasaki; Hiroshi Chiba, Yamato; Shinkichi Ohkawa, Ibaraki-ken, all of Japan

[73] Assignee: Canon Kabushiki Kaisha, Tokyo, Japan

[21] Appl. No.: 422,932

[22] Filed: Apr. 17, 1995

Related U.S. Application Data

[63] Continuation of Ser. No. 48,058, Apr. 19, 1993, abandoned, which is a continuation of Ser. No. 841,295, Feb. 28, 1992, abandoned, which is a continuation of Ser. No. 385,363, Jul. 27, 1989, abandoned.

[30] Foreign Application Priority Data

Aug. 2, 1988 [JP] Japan ................... 63-192193
Sep. 30, 1988 [JP] Japan ................... 63-246314

[51] Int. Cl.$^6$ ................................................. F16M 13/00
[52] U.S. Cl. ................................................. 248/612; 378/34
[58] Field of Search ................... 378/34, 208; 29/434, 29/436; 248/610, 612, 634, 638

[56] References Cited

U.S. PATENT DOCUMENTS

| | | | |
|---|---|---|---|
| 2,565,807 | 8/1951 | French et al. | 248/610 X |
| 4,106,740 | 8/1978 | Lloyd et al. | 248/358 R |
| 4,135,688 | 1/1979 | England | 248/610 X |
| 4,185,202 | 1/1980 | Dean et al. | 250/492 |
| 4,352,643 | 10/1982 | Iijima | 248/610 X |
| 4,803,712 | 2/1989 | Kembo et al. | 378/34 |
| 5,164,974 | 11/1992 | Kariya et al. | 378/34 |

FOREIGN PATENT DOCUMENTS

| | | | |
|---|---|---|---|
| 103188 | 3/1984 | European Pat. Off. . | |
| 134268 | 3/1985 | European Pat. Off. . | |
| 137633 | 8/1983 | Japan | 248/638 |

Primary Examiner—Joseph M. Gorski
Attorney, Agent, or Firm—Fitzpatrick, Cella, Harper & Scinto

[57] ABSTRACT

A method of supporting or mounting a precision instrument for supporting a mask and a wafer in a vacuum container is disclosed. The method is particularly applicable to an SOR X-ray exposure apparatus wherein the mask and the wafer are disposed in a desired level of the reduced pressure, and exposure energy such as X-rays contained in synchrotron radiation is projected onto the wafer through the mask to print the pattern of the mask onto the wafer. In x-y-z coordinates with the x direction being vertical, the precision instrument is hung at at least two points which are spaced in the x direction, to the inside wall of the vacuum container. At one of the supporting points, the precision instrument is given latitude of x, y and z direction movement, and at the other supporting point, the precision instrument is fixed or is given latitude only in the x direction. By this arrangement, when the vacuum container deforms by the difference between the internal and external pressures, the precision instrument can be supported correctly.

3 Claims, 7 Drawing Sheets

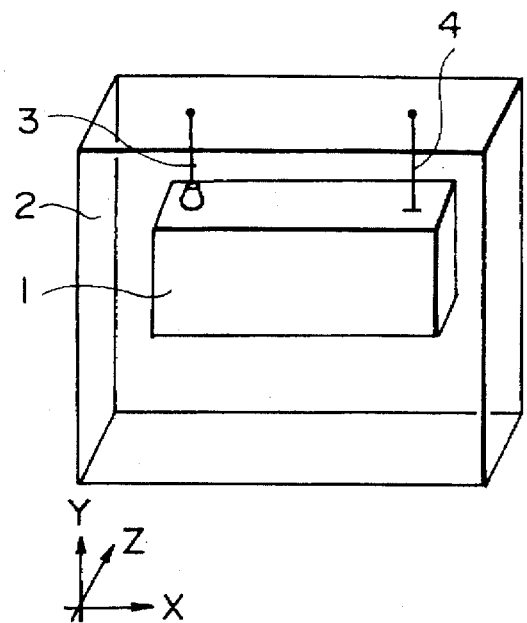 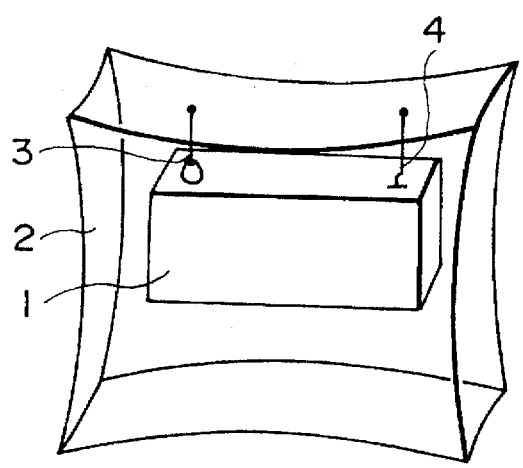
F I G. 1A  F I G. 1B
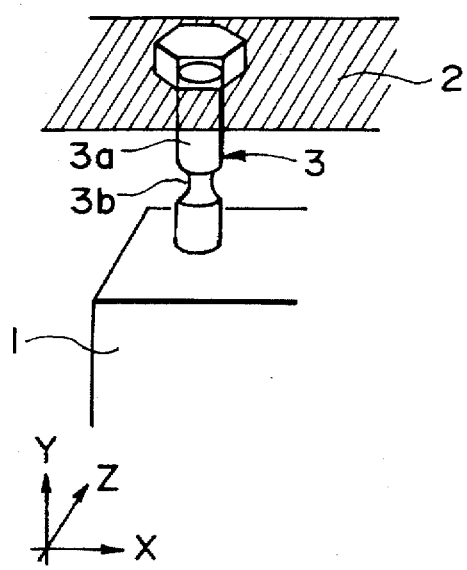 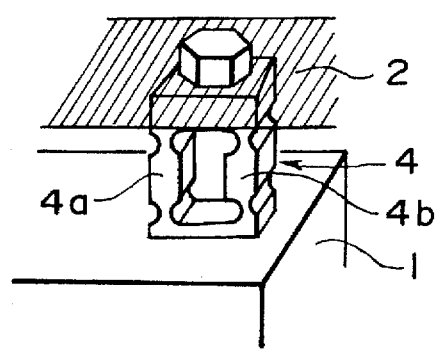
F I G. 2A  F I G. 2B

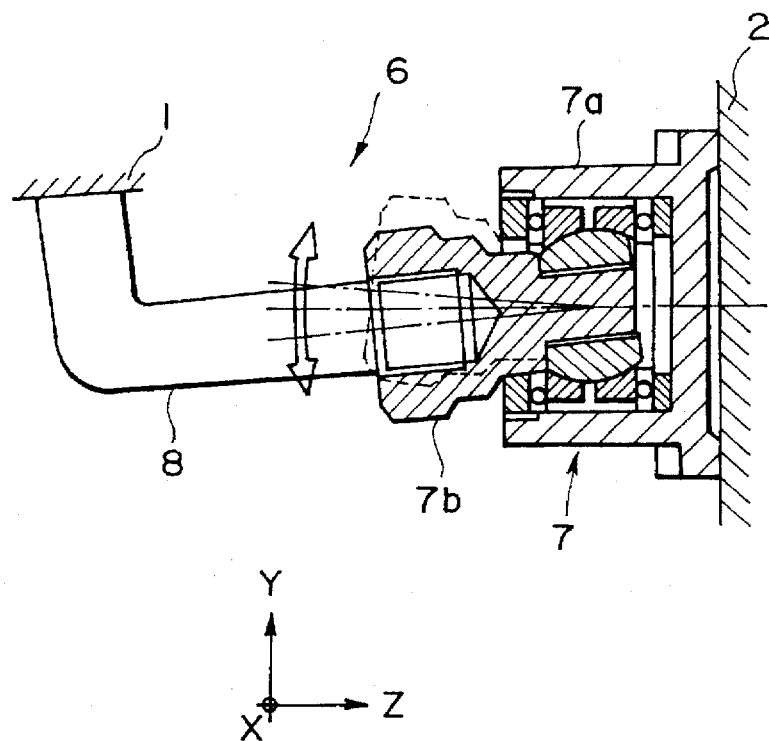
F I G. 5A
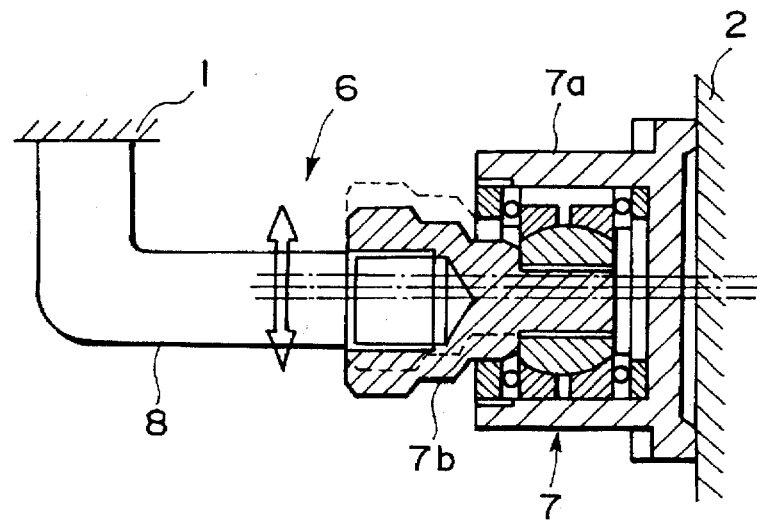
F I G. 5B

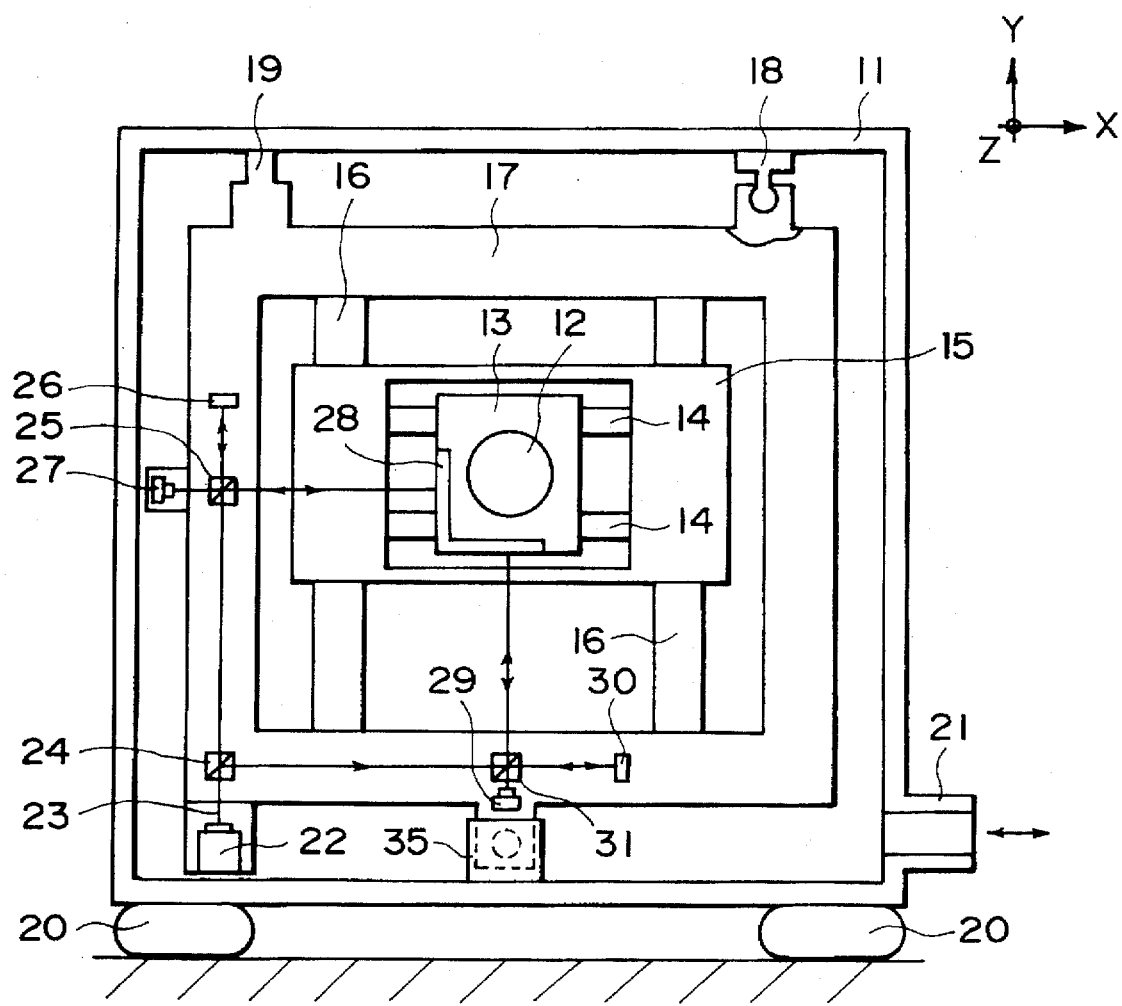
F I G. 6A

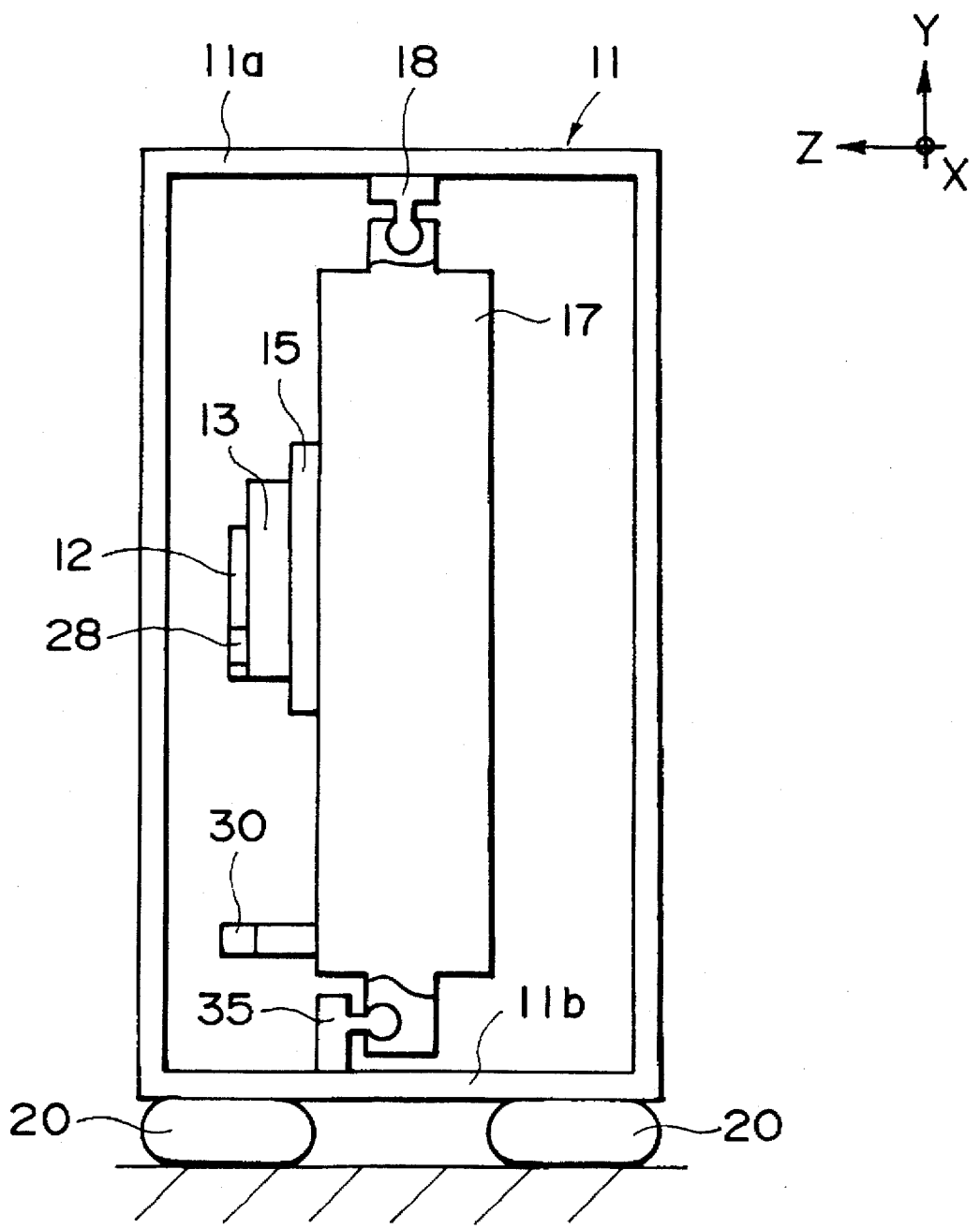
F I G. 6B

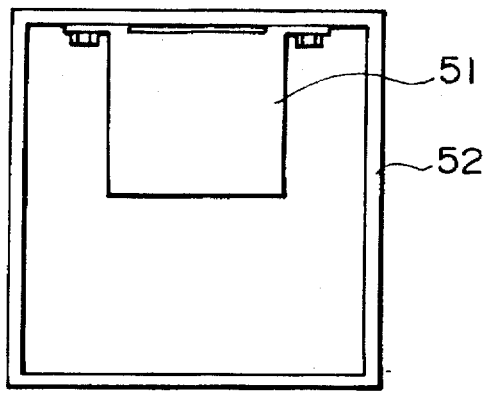
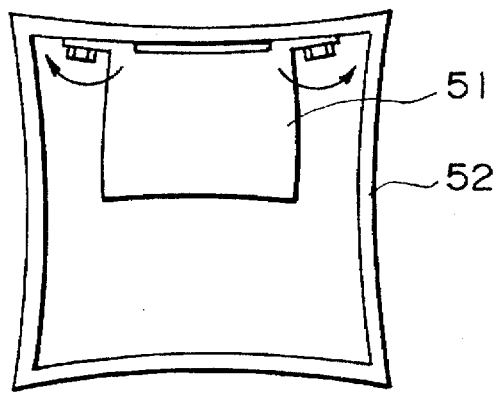
FIG. 8A        FIG. 8B
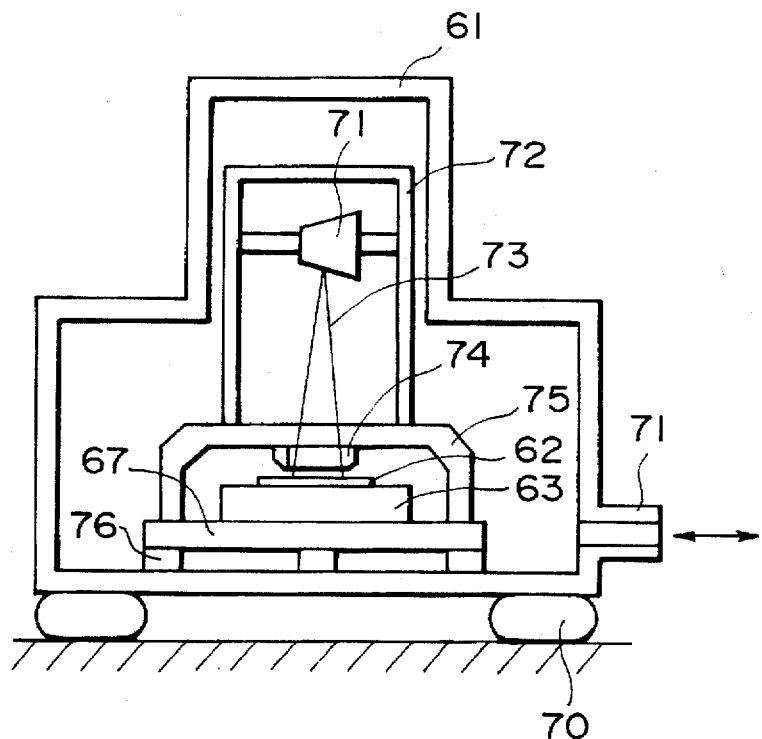
FIG. 9

MOUNTING METHOD

This application is a continuation of prior application, Ser. No. 08/048,058 filed Apr. 19, 1993, which application is a continuation of prior application, Ser. No. 07/841,295 filed Feb. 28, 1992, which application is a continuation of prior application, Ser. No. 07/385,363 filed Jul. 27, 1989, all now abandoned.

FIELD OF THE INVENTION AND RELATED ARTS

The present invention relates to a mounting method of mounting an instrument to a structural member, and more particularly, to a method for mounting a precision instrument in a vacuum container which is maintained under a reduced pressure in use. The method is applicable to a so-called SOR X-ray exposure apparatus wherein a mask and a semiconductor wafer are disposed in a reduced pressure chamber, and exposure energy such as X-rays contained in synchrotron radiation, for example, is projected to the wafer through the mask, thus printing the pattern of the mask to the wafer. More particularly, it relates to a method in which precision instruments for holding the mask and/or the wafer are suitably mounted to the inside of the vacuum container using the present invention.

Referring first to FIGS. 8A and 8B, there is shown a conventional mounting of a precision instrument to an inside of a vacuum container. FIG. 8A shows the container when the external pressure is equal to the internal pressure. A precision instrument 51 is directly mounted to the vacuum container 52 using screws or the like at plural positions. The mounting operation is performed while the internal pressure of the vacuum container 2 is at normal atmospheric pressure or at pressure close thereto. After the mounting operation, the pressure is reduced to the desired vacuum level.

FIG. 9 shows a conventional X-ray exposure apparatus comprising a vacuum chamber 61, an exhausting port 71, a known rotor type X-ray source 21, and an X-ray source supporting frame 72. The X-rays are designated by reference numeral 73. A mask 74 having a fine pattern is supported by a mask supporting frame 75. A wafer 62 is carried on a wafer carrying table 63 which is supported on a main frame 67. The vacuum chamber 61 and the main frame 67 are coupled by a leg 76. An anti-vibration unit 70 is provided to protect the entire apparatus from vibration.

SUMMARY OF THE INVENTION

When the internal pressure of the vacuum chamber 52 of FIG. 8A is reduced after the instrument is mounted, the vacuum container 52 contracts and deforms due to the difference between the external pressure (normal atmospheric pressure) and the internal pressure. The deformation of the vacuum chamber 52 produces an external force on the precision instrument 51 mounted at plural mounting points. FIG. 8B is a sectional view illustrating the production of the external force on the precision instrument 51 when the pressure is reduced. The external force is shown by the arrows.

When the external force is large, the constituent parts of the precision instrument 51 are changed in their electrical, mechanical and/or optical properties, even to such an extent that the precision instrument 51 can be damaged. Even if the external force is small, the performance of the precision instrument 51 would deteriorate when the high accuracy is required in the positional relationship between the internal precision instrument 51 and an external instrument. In order to reduce the external force, the conventional solutions are to increase the thickness of the vacuum container 51 and to add ribs to the container 51, which however, result in an increase of the weight of the vacuum container leading to cost increase.

In the X-ray exposure apparatus shown in FIG. 9, the adjustment of the various instrument and mechanisms in the vacuum chamber 61 are executed when the vacuum chamber 61 communicates with atmospheric pressure. After the completion of the adjustments, the pressure of the vacuum chamber is reduced through the exhausting port 71 to provide the desired vacuum level in the chamber 61. Therefore, when the pressure is reduced, a large force is produced in the wall of the chamber 61 due to the difference between the internal and external pressures, similar to the apparatus of FIG. 8A. This deforms the wall of the container. The container wall is influenced by the variation of the ambient pressure, and the amount of deformation changes correspondingly. Since the container wall and the main frame 67 are securedly fixed by the plural coupling legs 76, the deformation of the container wall results in an external force to the main frame 67. As a result, the main frame 67 is deformed. The main frame 67 is a reference base of the exposure apparatus, and on the main frame 67 there are mounted a measurement system (not shown) for positioning the wafer carrying table 63 and a mask supporting frame 75, and therefore, the main frame 67 deformation deteriorates the exposure performance of the apparatus.

To obviate this problem, it is considered that the thickness of the container wall is increased to suppress the deformation, or the rigidity of the main frame 67 is increased, so that the deformation of the main frame 7 is reduced. However, similar to the case of the FIG. 8A apparatus, the size, weight and manufacturing cost of the apparatus are increased.

Accordingly, it is a principal object of the present invention to provide a mounting method and member wherein when an instrument is mounted to a vacuum container, production of an external force due to the reduced inside pressure of the container is minimized to prevent damage or so that performance deterioration of the instrument is prevented.

According to an embodiment of the present invention, a mechanism or member is provided at the mounting portion to absorb the external force to the instrument due to deformation of the vacuum chamber such as contraction, expansion or bending. By this, the influence on the instrument by the reduction of the vacuum chamber pressure is reduced to prevent performance deterioration of the instrument.

The mounting to the vacuum container can be made using a hinge mechanism or a parallel hinge mechanism.

It is another object of the present invention to provide a mounting method and member applicable to an X-ray exposure apparatus.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 1A and 1B are perspective views showing a vacuum apparatus using a mounting method according to an embodiment of the present invention.

FIGS. 2A and 2B are perspective views illustrating details of the mounting means.

FIGS. 5A and 5B are sectional views illustrating the details of the mounting structure at a third mounting point in the embodiment shown in FIG. 4.

FIGS. 6A and 6B are sectional views of an SOR-X ray exposure apparatus using the mounting method according to an embodiment of the present invention.

FIGS. 8A and 8B show an example of a conventional vacuum container.

FIG. 9 shows an example of a conventional X-ray exposure apparatus.

DETAILED DESCRIPTION OF THE PREFERRED EMBODIMENTS

Figure 3:
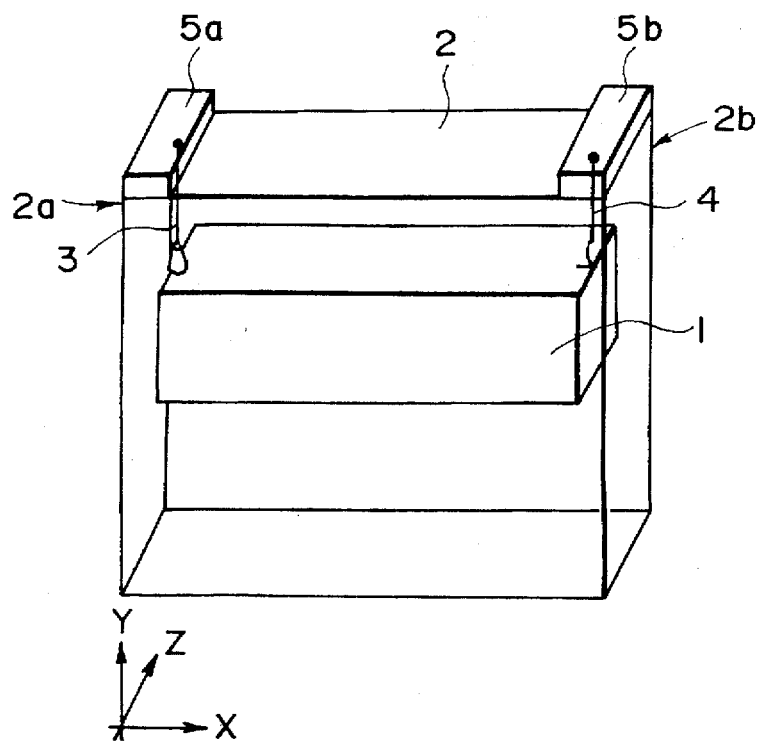
FIG. 3 is a perspective view of an apparatus using a mounting method according to another embodiment of the present invention.

Referring to FIGS. 1A and 1B an apparatus using the mounting method according to an embodiment of the present invention is shown, wherein the left-right direction, a vertical direction and a front-rear direction are indicated by x, y and z in an x-y-z coordinate system. These directions apply to the subsequent drawings. A precision instrument 1 in the form of a unit is inside a vacuum container, and the internal pressure thereof is maintained at a desired reduced pressure level when it is in use. Supporting members 3 and 4 are provided to hang the precision instrument 1 in the vacuum container 2. The mounting members 3 and 4 are spaced apart by a predetermined distance in the direction x.

As shown in FIG. 2A, the mounting member 3 has a rod 3a having a reduced diameter portion 3b adjacent a longitudinal central portion thereof. This is effective to confine a linear displacement of the precision instrument 1 relative to the wall of the vacuum chamber 2 in all of the directions x, y and z, while permitting rotational movement of the precision instrument 1 in the vacuum container 2 about the x-, y- and z-axes, thus providing a hinge mechanism. The mounting member 3 is fixed both to the precision instrument 1 and the vacuum container 2. The mounting member 4, as shown in FIG. 2B, is in the form of parallel leaf springs 4a and 4b extending in the direction x. This is manufactured by hollowing a mass of a material. The mounting member 4 is effective to permit a linear movement in the direction x relative to the vacuum container 2, while confining movements in the directions y and z, thus providing a parallel hinge mechanism. The mounting member 4 is mounted between the precision instrument 1 and the vacuum container 2 so as not to confine the rotation of the precision instrument 1 relative to the vacuum container 2 about the axes x, y and z.

In FIG. 1A, the fine instrument 1 has been mounted to the vacuum container 2, and the inside of the vacuum container 2 communicates with the external surroundings so that the internal pressure of the container is equal to the external pressure (atmospheric pressure) or it is maintained a little lower than that. In FIG. 1B, the internal pressure of the vacuum container 2 is reduced by an unshown vacuum pump to a desired reduced pressure level. In FIG. 1B, the wall of the vacuum container 2 is contracted and deformed due to the difference between the internal pressure and the external pressure. More particularly, the cubic vacuum container 2, in this embodiment, is deformed such that the central portion of the respective walls displace toward the inside.

In this embodiment, even if the vacuum container 2 contracts and deforms in this manner, the mounting members 3 and 4 having the structure described above absorb the deformation of the container 2, and therefore, to the precision instrument 1 is imparted by the force required only for deforming the mounting members 3 and 4 as the reaction force. The force an be determined by the shapes and materials of the mounting members 3 and 4. By selecting these properly, the magnitude of the external force can be reduced to a sufficient extent. By doing so, even if the vacuum container 2 deforms from the state of FIG. 1A to the state of FIG. 1B, the precision instrument 1 can be correctly maintained at the predetermined position in the x-y-z coordinates, according to this embodiment.

In the foregoing embodiment, the precision instrument 1 is mounted to the vacuum container 2 wall using two mounting members 3 and 4 to hang it, but another mounting method is usable corresponding to the shape of the vacuum container 2 and the function of the precision instrument 1.

Referring to FIG. 3, there is shown another embodiment wherein the positions of the mounting members 3 and 4 are so selected that the deformation due to the pressure reduction is small, and more particularly, in the neighborhood 2a and 2b of the corners of the cubic vacuum container 2. In this embodiment, reinforcing plates 5a and 5b are mounted at the corners 2a and 2b to further strengthen the rigidity of the position where the mounting members 3 and 4 are provided. By this, the change of the precision instrument 1 position due to the pressure reduction can be further decreased. This mounting method is particularly advantageous when a highly precise relative positional relation is desired between the precision instrument 1 and another instrument disposed outside the vacuum container 2.

Figure 4:
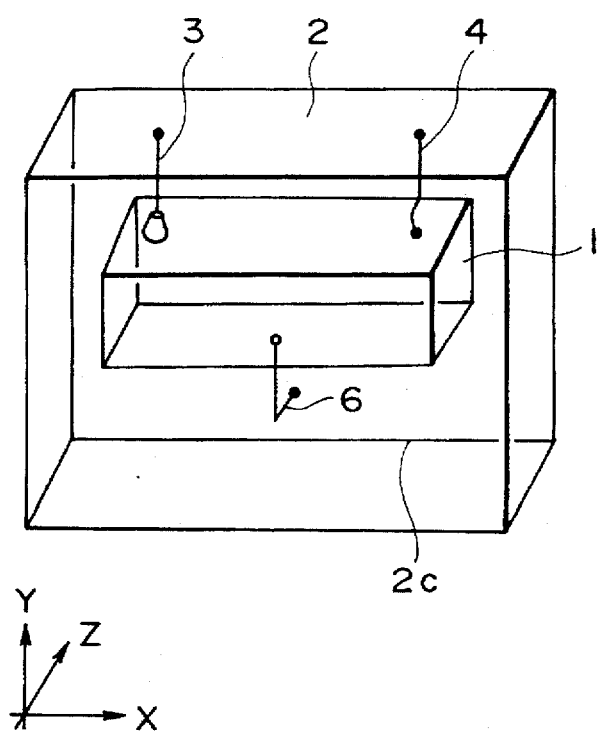
FIG. 4 is a perspective view of an apparatus using a mounting method (three point mounting) method according to a further embodiment of the present invention.

Referring to FIG. 4, there is shown an embodiment wherein the confinement is imparted to the rotational displacement of the precision instrument 1 about the axis x relative to the vacuum container 2. In the previous embodiment, the number of mounting positions is two. In the present embodiment, an additional mounting member 6 is used at the bottom of the precision instrument 1 to confine only the z direction displacement of the precision instrument 1 about relative to the vacuum container 2. By this, a swinging movement of the precision instrument 1 about the x axis can be suppressed.

FIGS. 5A and 5B illustrate the details of the mounting member 6. The mounting member 6 includes a known spherical seat mechanism 7. A movable member 7b is rotatable relative to the housing 7a about the x-axis, y-axis and z-axis as shown in FIG. 5A, and simultaneously, the movable member 7b is movable in the directions x and y, while it is confined in the direction z, as shown in FIG. 5B. An L-shaped rod 8 is fixed to the precision instrument 1 at its end, and is also fixed to the movable member 7b at its other end. The housing 7a of the spherical seat mechanism 7 is fixed to the side wall of the vacuum container 2 adjacent a corner 2c. The end of the rod 8 is connected to the precision instrument 1 at a position which is substantially the center of the bottom surface of the precision instrument 1 in the direction x.

Referring to FIG. 6, an SOR X-ray exposure apparatus utilizing the mounting method of the present invention will be described. In this apparatus, a mask and a wafer are disposed in a desired reduced pressure ambience, and exposure energy such as the x-rays contained in synchrotron radiation is applied to the wafer through the mask to print the pattern of the mask on the wafer.

FIGS. 6A and 6B are front and side views of the apparatus. A vacuum container 11 is effective to keep the reduced pressure in the exposure ambience around an unshown mask and a wafer 12. An X-stage 13 moves the wafer 12 in the direction x when the shot areas of the wafer 12 are sequentially exposed to the pattern of the mask in a step-and-repeat manner. The x-stage 13 is guided by an x-axis guiding bar. A y-stage 15 moves the wafer 12 in the direction y during the step-and-repeat exposure, similar to the x-stage 13. The y-stage 15 is guided by a y-axis guiding bar. The x-axis guiding bar 14 is securely fixed to the y-stage 15. A main frame 17 supports the y-stage 15 through the y-axis guiding bar 16. A mounting member 18 having a spherical seat and a mounting member 19 serve to hang the main frame 17 in the vacuum container 11. The function of the mounting members are similar to the mounting members 3 and 4 described in conjunction with FIG. 1. A mounting member 35 having a glancing spherical seat has the same functions as the mounting member 6 shown in FIGS. 4 and 5A and 5B. The apparatus further comprises an anti-vibration unit 20 for the vacuum container 11, a vacuum exhausting port connected to an unshown vacuum pump, a laser source for a laser interferometer for determining the positions of the x-stage 13 and the y-stage 15, a laser optical path 23, half mirrors 24, 25 and 29, a reference mirror 26 for determining the position of the x-stage 13, a detector 27 for the interferometer for determining the position of the x-stage 13, a square mirror 28 movable together with the x-stage 13, a reference mirror 30 for determining the position of the y-stage 15, and a detector for the interferometer for determining the position of the y-stage. The port 21 is formed in the vacuum container 11. The above elements for determining the position of the x-stage 13 and the y-stage 15 are fixed on the main frame 17. This apparatus is assembled in the following manner. First, the y-axis guiding bar 16 is mounted to assure the movement accuracy of the y-stage 15 relative to a reference provided in the main frame 17. Next, the x guiding bar 14 is mounted to assure the perpendicularity of the movement of the x-stage 13 relative to the direction of movement of the y-stage 15. The position measurement system for the x-stage 13 and the y-stage 15 is mounted on the main frame 17, and the optical axes are adjusted correctly. The above mounting and adjusting operations are performed in the normal atmospheric pressure. Thereafter, an unshown door of the container 11 is closed, and the air therein is discharged by the unshown vacuum pump through the exhausting port 21. With respect to the position of the main frame 17 relative to the wall of the container 11, the supporting member 18 having the spherical seat confines it only in the y direction, and the supporting member 35 having the glancing spherical seat confines it in only the z direction. The supporting member 19 confines the main frame 17 in all directions to assure the position of the main frame 17 relative to the wall of the chamber. Even when the chamber wall deforms due to the air discharge described above, and deformations of the top and bottom surfaces 11a and 11b (FIG. 6B) of the container which are provided with supporting members 18, 19 and 35 for the main frame 17, are produced in all directions, namely, in the directions x, y and z and in the rotational directions about the x-axis, y-axis and z-axis, the main frame 17 is free from deformation of the main frame 17 if the deformation is within the stroke of the two spherical seats.

In this embodiment, the spherical seat is used for absorbing the deformation, but it may be replaced with a leaf spring structure or a sliding mechanism.

Figure 7A:
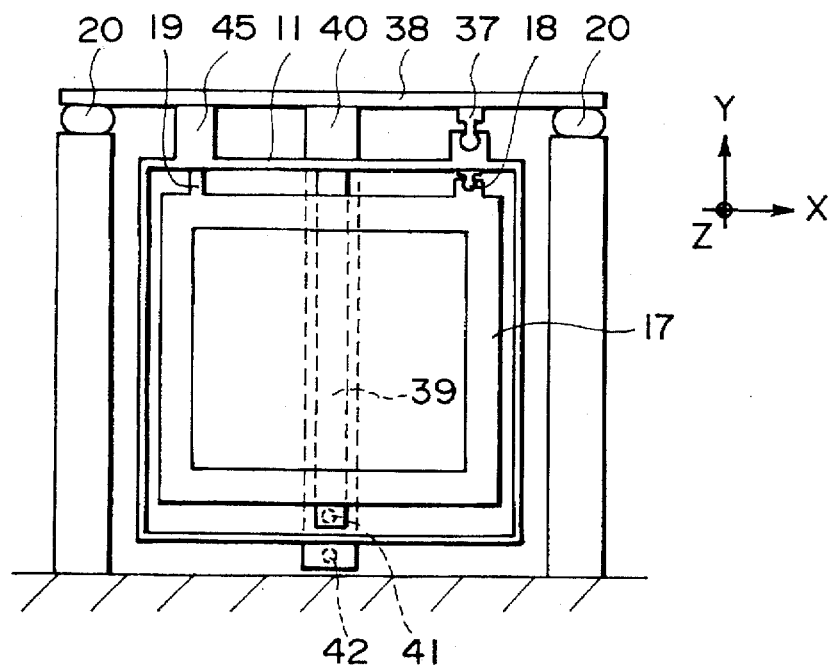
FIGS. 7A and 7B show an SOR-X ray exposure apparatus according to another embodiment of the present invention.
Figure 7B:
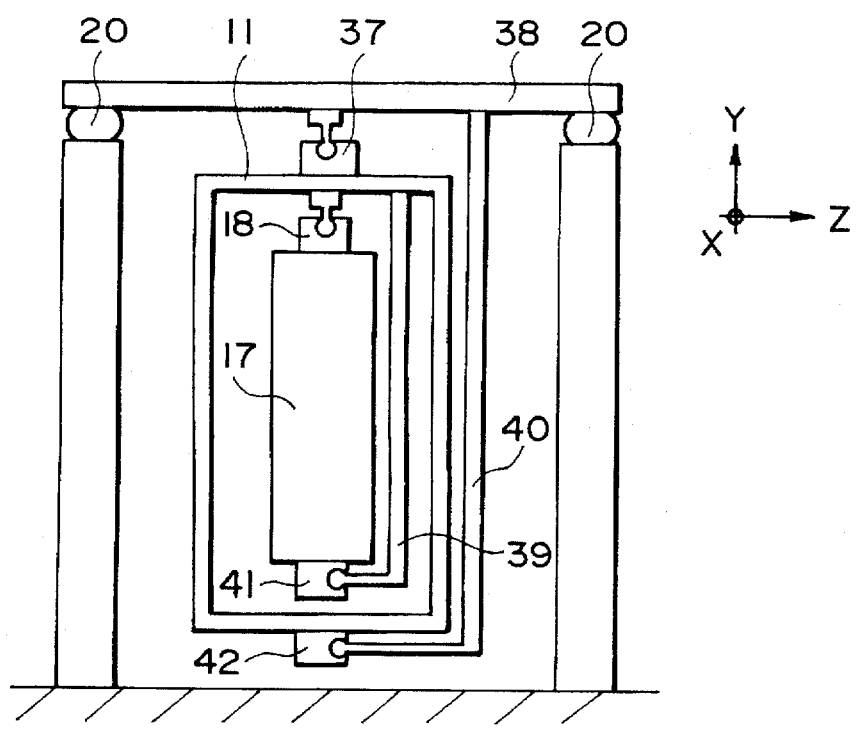

Referring to FIGS. 7A and 7B, another embodiment will be described wherein the vacuum chamber 11 is not placed on the floor through the anti-vibration unit 20, but it is suspended from an anti-vibration base 38 supported through the anti-vibration unit, in an SOR X-ray exposure apparatus. FIGS. 7A and 7B are front and side views of the apparatus. An L-rod 39 has an end securedly fixed to the top surface of the vacuum container 11 and the other end is connected to the bottom surface of the main frame 17 through a supporting member 41 having a spherical sheet. The mounting member 41 has the function, the same as that of the supporting member 35 of FIG. 6 to confine the displacement of the main frame 17 in the z direction. The vacuum container is suspended from the anti-vibration base 38 by a mounting member 45 and a mounting member 37 having a spherical seat. The mounting member 45 has a confining function in all directions, but the mounting member 17 having the spherical seat confines the displacement only in the y direction of the vacuum chamber 11 relative to the anti-vibration base. The mounting points of the mounting members 19 and 45 are aligned in the direction x. Similarly, the supporting points of the mounting members 18 and 37 are along a line extended in the direction y.

The end of the L-shaped rod having the other end fixed to the anti-vibration plate 38 is connected to the bottom surface of the vacuum chamber 11 through the mounting member 42 having a spherical seat. A mounting member 42 confines movement of the vacuum container 11 relative to the anti-vibration base 38 only in the direction z. The supporting points of the mounting members 41 and 42 are on a line extending in the direction y. The other structures are the same as those of the FIG. 6 apparatus, and the description thereof will be omitted for simplicity. According to this embodiment, the deformation of the anti-vibration base 38 by its own weight is not transmitted to the main frame 17.

As described in the foregoing, according to the present invention, the mounting member for mounting the precision instrument to the vacuum container is deformable or rotatable, and therefore, the external force applied to the precision instrument due to the deformation of the vacuum container resulting from the reduction of the internal pressure can be significantly reduced. This is effective to prevent performance change or damage of the precision instrument.

In addition, the influence of the deformation of the vacuum container is not significantly transmitted to the internal precision instrument, and therefore, the thickness of the vacuum container is reduced, so that the weight of the apparatus can be reduced. If the present invention is applied to the precision instrument such as a fine stage or the like used in a semiconductor manufacturing apparatus or the like, the advantages is very significant in the enhancement of the performance of the precision instrument, reduction of the weight of the entire apparatus and reduction of the size of the apparatus.

While the invention has been described with reference to the structures disclosed herein, it is not confined to the details set forth and this application is intended to cover such modifications or changes as may come within the purposes of the improvements or the scope of the following claims.

What is claimed is:

1. An apparatus comprising:

a container, which is capable of having its inside pressure reduced;

an instrument which is hingedly suspended within said container from an surface of said container by a first supporting member and a second supporting member, and a third supporting member supporting a lower portion of said instrument in said container;

said first supporting member comprising a rod with a reduced diameter portion adjacent a longitudinal central portion thereof, said rod being rotatable relative to said upper surface such that said instrument can rotate relative to said upper surface;

said second supporting member comprising two parallel leaf springs, said leaf springs being movable relative to said upper surface along a linear path such that said instrument can move relative to said upper surface along said linear path; and said third supporting member comprising a spherical seat mechanism.

2. The apparatus according to claim 1, wherein said instrument comprises a movable stage device.

3. The apparatus according to claim 2, wherein said movable stage device includes a mechanism to hold a substrate to be exposed to radiation.

* * * * *

UNITED STATES PATENT AND TRADEMARK OFFICE
CERTIFICATE OF CORRECTION

Page 1 of 2

PATENT NO. : 5,687,947
DATED : November 18, 1997
INVENTOR(S) : KAZUNORI IWAMOTO, ET AL.

It is certified that error appears in the above-identified patent and that said Letters Patent is hereby corrected as shown below:

COLUMN 2:

Line 3, "which" should read --which,--.

COLUMN 3:

Line 14, "SOR-Xray" should read --SOR X-ray--.

COLUMN 4:

Line 10, "an" should read --can--.

COLUMN 5:

Line 1, "x-rays" should read --X-rays--; and
Line 7, "X-stage" should read --x-stage--.

UNITED STATES PATENT AND TRADEMARK OFFICE
CERTIFICATE OF CORRECTION

PATENT NO. : 5,687,947
DATED : November 18, 1997
INVENTOR(S) : Kazunori Iwamoto, et. al.

It is certified that error appears in the above-identified patent and that said Letters Patent is hereby corrected as shown below:

Column 6:

Line 66, "an surface" should read --an upper surface--.

Signed and Sealed this

Nineteenth Day of May, 1998

BRUCE LEHMAN

*Attest:*

*Attesting Officer*   Commissioner of Patents and Trademarks